(12) United States Patent
Wang et al.

(10) Patent No.: US 11,802,915 B2
(45) Date of Patent: Oct. 31, 2023

(54) UNCERTAIN NOISY FILTERING-BASED FAULT DIAGNOSIS METHOD FOR POWER BATTERY MANAGEMENT SYSTEM

(71) Applicant: Jiangnan University, Wuxi (CN)

(72) Inventors: Ziyun Wang, Wuxi (CN); Yan Wang, Wuxi (CN); Yacong Zhan, Wuxi (CN); Zhicheng Ji, Wuxi (CN); Zixing Liu, Wuxi (CN); Yuqian Chen, Wuxi (CN); Leiting Huo, Wuxi (CN)

(73) Assignee: JIANGNAN UNIVERSITY, Wuxi (CN)

( * ) Notice: Subject to any disclaimer, the term of this patent is extended or adjusted under 35 U.S.C. 154(b) by 0 days.

(21) Appl. No.: 17/873,265

(22) Filed: Jul. 26, 2022

(65) Prior Publication Data

US 2022/0381838 A1 Dec. 1, 2022

Related U.S. Application Data

(63) Continuation of application No. PCT/CN2022/074161, filed on Jan. 27, 2022.

(30) Foreign Application Priority Data

Feb. 5, 2021 (CN) .......... 202110169955.X
Apr. 1, 2021 (CN) .......... 202110365238.4

(51) Int. Cl.
*G01R 31/385* (2019.01)
*G01R 31/367* (2019.01)
*G01R 31/374* (2019.01)

(52) U.S. Cl.
CPC ......... *G01R 31/385* (2019.01); *G01R 31/367* (2019.01); *G01R 31/374* (2019.01)

(58) Field of Classification Search
CPC ..... G06F 30/20; G01R 31/385; G01R 31/374; G01R 31/367; G01R 31/382; B60L 58/10;
(Continued)

(56) References Cited

U.S. PATENT DOCUMENTS

2016/0371485 A1 12/2016 Onabajo et al.
2020/0166577 A1* 5/2020 Walder ............... G01R 31/3842

FOREIGN PATENT DOCUMENTS

CN 109474472 A 3/2019
CN 110377921 A 10/2019
(Continued)

OTHER PUBLICATIONS

Dey, Satadru. et. al. "Model-based real-time thermal fault diagnosis of lithium-ion batteries" Control Engineering Practice 56 (Aug. 15, 2016) 37 48.
(Continued)

*Primary Examiner* — Patrick Assouad
*Assistant Examiner* — Trung Q Nguyen
(74) *Attorney, Agent, or Firm* — IPRO, PLLC

(57) ABSTRACT

An uncertain noisy filtering-based fault diagnosis method for a power battery management system is described. The method includes establishing an electro-thermal coupling model of the power battery system; extending an output vector of the system according to a state constraint of a power battery, and expanding a state vector of the system according to a fault of the power battery system to obtain an augmented system of the power battery system; obtaining an estimation interval of a power battery sensor fault by using a zonotope Kalman filtering method; judging whether the power battery management system has a fault according to
(Continued)

upper and lower bounds of fault estimation; if a fault occurs, determining a fault type and a fault time according to a result.

13 Claims, 4 Drawing Sheets

(58) Field of Classification Search
CPC .............. H01M 10/42; H01M 10/425; H01M 10/0525; Y02E 60/10
USPC ................................................ 324/424–435
See application file for complete search history.

(56) References Cited

FOREIGN PATENT DOCUMENTS

| | | |
|---|---|---|
| CN | 112305418 A | 2/2021 |
| JP | 2008154424 A | 7/2008 |

OTHER PUBLICATIONS

Scott, Joseph K. et al. "Input design for guaranteed fault diagnosis using zonotopes" Automatica, Apr. 24, 2014, 6 (50), p. 1580-1589.

\* cited by examiner

UNCERTAIN NOISY FILTERING-BASED FAULT DIAGNOSIS METHOD FOR POWER BATTERY MANAGEMENT SYSTEM

TECHNICAL FIELD

The present disclosure relates to an uncertain noisy filtering-based fault diagnosis method for a power battery management system and belongs to the field of power battery management system fault diagnosis.

BACKGROUND

With the increasing attention of people to fuel consumption and carbon emission, the power battery gradually becomes the most promising chemical energy storage power source because of its high energy density, low self-discharge rate and long service life, and is widely used in various aspects in the energy storage field of power transmission and distribution, renewable energy grid-connection, auxiliary service, distributed micro-grids, electric vehicle charging and switching and the like. But at the same time, with the continuous improvement of the power battery in energy and power density, the safety and reliability of the battery have also become the most concerned issues in the battery energy storage system.

A corresponding battery management system (BMS) is therefore provided in the existing power battery system to ensure that the power battery is in a safe operating state. Generally, an existing BMS collects the current and voltage of the power battery and the temperature sensor signal via sensors, employs a corresponding state estimation method to estimate the state of the power battery system according to the current, voltage and temperature sensor signal collected by the sensor, then compares the estimated state of the battery system with the normal state of the battery system, and judges whether the power battery has a fault according to the comparison result; and in the judgment process, once the power battery has a fault, the corresponding current, voltage and temperature sensor signal will become abnormal. The subsequently estimated battery system state greatly differs from the normal battery system state, so that it is possible to diagnose whether the power battery has a fault.

However, the accuracy of the above-mentioned fault diagnosis method is based on that the sensor does not have a fault, that is, the data collected by the sensor is the real data of the battery system, and if the sensor has a fault, the collected signal will be inconsistent with the actual condition and the difference between the battery system state subsequently estimated by the state estimation method according to the collected signal and the normal battery system state may be relatively large, and may be within the normal range, which depends on what kind of fault the sensor has. However, no matter what kind of fault the sensor has, the result of fault diagnosis is inaccurate by this time.

If the estimated battery system state differs greatly from the normal battery system state, it is judged that the power battery has a fault, but actually it is not that the power battery has a fault, but the sensor in the battery management system has a fault; if the difference between the estimated battery system state and the normal battery system state is within the normal range, it is judged that the power battery does not have a fault, but actually because the sensor in the battery management system has a fault, an error will occur in judging the state of the power battery, and then the subsequent operation on the battery is affected. For example, the power battery has already reached a state where charging is completed, but because the sensor has a fault, it is estimated according to the collected signal that the power battery is in a state where charging is not completed, then the charging operation will continue, and an over-charging phenomenon will occur; whether the power battery is in the above-mentioned over-charging state or over-discharging state, it may cause a potential safety hazard event.

Therefore, in order to solve the problem that the existing fault diagnosis method for the power battery cannot diagnose whether the sensor responsible for collecting the signal has a fault, the present application provides an uncertain noisy filtering-based fault diagnosis method for a power battery management system.

SUMMARY

In order to solve the problem that an existing battery fault diagnosis method cannot detect a sensor fault in a battery system, the present disclosure provides an uncertain noisy filtering-based fault diagnosis method for a power battery system, and the method includes:

step 1: according to the electrochemical mechanism of the power battery discharge process, establishing a second-order Thevenin equivalent circuit model of a power battery;

step 2: according to the heat generation mechanism of the power battery, establishing a thermal model of the power battery, and in combination with the second-order Thevenin equivalent circuit model, establishing an electro-thermal coupling model of the power battery system;

step 3: acquiring a core temperature and a surface temperature of the power battery in a normal working state, and determining a state constraint of the power battery;

step 4: expanding the state constraint of the power battery to a system output vector of the power battery system to obtain a system output variable, and expanding a fault vector of the power battery system to a system state vector to obtain a system state variable;

the system output vector being a vector composed of the core temperature and the surface temperature collected by a core temperature sensor and a surface temperature sensor; the fault vector being a vector formed by fault values of the core temperature sensor and the surface temperature sensor; the system state vector referring to a vector composed of an actual core temperature and an actual surface temperature of the power battery;

step 5: obtaining a zonotope set according to a system state variable $\bar{x}_k$ at time k, constructing a zonotope set of a system state variable prediction set $\hat{\chi}_{k+1}$ at time k+1 according to the corresponding zonotope set of the system state variable $\bar{x}_k$ at time k, and constructing a strip space $S_{k+1}$ at time k+1 according to the system output variable at time k+1;

step 6: solving an intersection of the zonotope set of the system state variable prediction set $\hat{\chi}_{k+1}$ at time k+1 and the constructed strip space $S_{k+1}$ at time k+1, and wrapping with a zonotope of the minimum volume to obtain a zonotope set of a system state variable $\bar{x}_{k+1}$ at time k+1;

step 7: acquiring a state estimation interval and a fault estimation interval at time k+1 according to the zonotope set of the system state variable at time k+1, and judging whether the core temperature sensor and the surface temperature sensor in a power battery management system have a fault;

the power battery system including the power battery and the power battery management system, and the power battery management system including the core temperature sensor and the surface temperature sensor for collecting the core temperature and the surface temperature of the power battery.

Optionally, the step 3: acquiring the core temperature and the surface temperature of the power battery in the normal working state, and determining the state constraint of the power battery, including:

acquiring the core temperature and the surface temperature of the power battery in the normal working state, and determining a state constraint of the system:

when the power battery works under a normal working condition, the core temperature $T_c$ satisfies $M_1°$ C.$\leq T_c \leq M_2°$ C.; there is a difference value between the core temperature and the surface temperature, and the difference value is stabilized within a range of m° C.$\pm\varepsilon°$ C., namely m$-\varepsilon°$ C.$\leq T_c - T_s \leq$ m$+\varepsilon°$ C.;

determining the state constraint of the system:

$$\begin{cases} |T_{c,k} - T_{s,k} - m| \leq \varepsilon \\ \left| T_{c,k} - \frac{M_1 + M_2}{2} \right| \leq \frac{M_2 - M_1}{2} \end{cases}$$

writing the state constraint of the system into the form of Equation (7):

$$|\gamma_k - H_k x_k| \leq l_k, \ h(x_k) = \gamma_k - H_k x_k \qquad (7)$$

Where, $$l_k = \begin{bmatrix} \varepsilon \\ \frac{M_2 - M_1}{2} \end{bmatrix}, \ \gamma_k = \begin{bmatrix} -m \\ -\frac{M_2 - M_1}{2} \end{bmatrix}, \ H_k = \begin{bmatrix} -1 & 1 \\ -1 & 0 \end{bmatrix}.$$

Optionally, the step 1: according to the electrochemical mechanism of the power battery discharge process, establishing the second-order Thevenin equivalent circuit model of the power battery, includes:

establishing equations as follows according to the electrochemical mechanism of the power battery discharge process:

$$U = U_{oc} - R_o i - U_1 - U_2 \qquad (1)$$

$$\begin{cases} \dot{U}_1 = -\frac{1}{R_1 C_{p1}} U_1 + \frac{1}{C_{p1}} i \\ \dot{U}_2 = -\frac{1}{R_2 C_{p2}} U_2 + \frac{1}{C_{p2}} i \end{cases}$$

where, U is a voltage at two ends of the battery, $U_{oc}$ is the internal voltage of the battery, $R_1$ and $C_{p1}$ are respectively electrochemical polarization internal resistance and capacitance, and a voltage at the two ends after $R_1$ and $C_{p1}$ are connected in parallel is $U_1$; $R_2$ and $C_{p2}$ are respectively concentration polarization resistance and capacitance, and a voltage at the two ends after $R_2$ and $C_{p2}$ are connected in parallel is $U_2$; i is a discharge current; $R_o$ is the internal resistance of the battery.

Optionally, the step 2: according to the heat generation mechanism of the power battery, establishing the thermal model of the power battery, and in combination with the second-order Thevenin equivalent circuit model of the power battery, establishing the electro-thermal coupling model of the power battery, includes:

2.1: according to the heat generation mechanism of the power battery, establishing the thermal model of the power battery:

$$\begin{cases} C_c \dot{T}_c = Q_{gen} + \frac{T_s - T_c}{R_c} \\ C_s \dot{T}_s = \frac{T_e - T_s}{R_u} - \frac{T_s - T_c}{R_c} \end{cases} \qquad (2)$$

where $T_s$ and $T_c$ represent the battery surface temperature and the battery core temperature respectively, and $T_e$ represents an ambient temperature; $C_s$ and $C_c$ respectively represent a heat capacity coefficient of a material inside the battery and a heat capacity coefficient of the surface of the battery; $R_c$ represents a thermal resistance between the core and the surface of the battery; $R_u$ represents a convection resistance between the surface of the battery and cooling air; $Q_{gen}$ represents the heating power of the core of the battery:

$$Q_{gen} = i(U_{oc} - U) = i(R_o i + U_1 + U_2) \qquad (3)$$

2.2: in combination with the second-order Thevenin equivalent circuit model, establishing the electro-thermal coupling model of the power battery system, taking the heating power $Q_{gen}$ of the core of the battery and the ambient temperature $T_e$ as the input of the electro-thermal coupling model, taking the surface temperature $T_s$ and the core temperature $T_c$ as the state vector of the electro-thermal coupling model, setting a sampling time interval as $\Delta$ts, discretizing Equation (2), and adding a disturbance noise to obtain the state equation of the electro-thermal coupling model:

$$x_{k+1} = A x_k + B u_k + D_1 w_k \qquad (4)$$

where, $x_k \in \mathbb{R}^n$ is the system state vector, $\mathbb{R}^n$ represents an n-dimensional real number space, $x_k = [T_{c,k}, T_{s,k}]^T$, $T_{c,k}$ and $T_{s,k}$ respectively represent real values of the core temperature and the surface temperature of the battery at time k; $u_k \in \mathbb{R}^r$ is a system input matrix at time k; $u_k = [Q_{gen,k}, T_{e,k}]^T$, $w_k \in \mathbb{R}^w$ represents an unknown but bounded disturbance noise, $\tilde{w}$ is a boundary value; $|w_k| \leq \tilde{w}$;

$$A = \begin{bmatrix} 1 - \frac{\Delta t}{R_c C_c} & \frac{\Delta t}{R_c C_c} \\ \frac{\Delta t}{R_c C_s} & 1 - \frac{\Delta t}{R_c C_s} - \frac{\Delta t}{R_u C_s} \end{bmatrix}$$

represents a state space matrix;

$$B = \begin{bmatrix} \frac{\Delta t}{C_c} & 0 \\ 0 & \frac{\Delta t}{R_u C_s} \end{bmatrix}$$

represents an input matrix;

$$D_1 = \begin{bmatrix} 1 & 0 \\ 0 & 1 \end{bmatrix}$$

represents a disturbance action matrix;

taking measured values of the surface temperature $T_s$ and the core temperature $T_c$ as the output of the electro-thermal coupling model, and adding a measurement noise and a sensor fault vector at the same time to obtain the output equation of the electro-thermal coupling model:

$$y_k = Cx_k + D_2 v_k + f_k \quad (5)$$

where, $y_k \in \mathbb{R}^p$ is the system output vector, $\mathbb{R}$ represents a p-dimensional real number space, $y_k = [T_{c,k}', T_{s,k}']^T$, $T_{c,k}'$ and $T_{s,k}'$, respectively represent measured values of the core temperature and the surface temperature of the battery; $v_k \in \mathbb{R}^v$ represents an unknown but bounded measurement noise, $\tilde{\mathbb{R}}^v$ represents a v-dimensional real number space, and $\tilde{v}$ is a boundary value, $|v_k| \le \tilde{v}$;

$$C = \begin{bmatrix} 1 & 0 \\ 0 & 1 \end{bmatrix}$$

represents an output matrix, and $$D_2 = \begin{bmatrix} 1 & 0 \\ 0 & 1 \end{bmatrix}$$

represents a measurement noise action matrix; $f_k = [f_{1,k}\ f_{2,k}]^T \in \tilde{\mathbb{R}}^p$ represents a sensor fault of the power battery, $f_{1,k}$ represents a core temperature sensor fault of the power battery, and $f_{2,k}$ represents a surface temperature sensor fault of the power battery;

according to Equation (4) and Equation (5), establishing the electro-thermal coupling model of the power battery system as:

$$\begin{cases} x_{k+1} = Ax_k + Bu_k + D_1 w_k \\ y_k = Cx_k + D_2 v_k + f_k \end{cases} \quad (6)$$

Optionally, the step 4: expanding the state constraint of the power battery to the system output vector of the power battery system to obtain the system output variable, and expanding the fault vector of the power battery system to the system state vector to obtain the system state variable, includes:

4.1: expanding the state constraint of the power battery to the system output vector of the power battery system to obtain the system output variable, and according to Equation (6) and Equation (7), obtaining an Equation (8) as follows:

$$\begin{cases} x_{k+1} = Ax_k + Bu_k + D_1 w_k \\ \bar{y}_k = \bar{C} x_k + \bar{D}_2 \bar{v}_k + \bar{f}_k \end{cases} \quad (8)$$

where, $$\bar{C} = \begin{bmatrix} C \\ H_k \end{bmatrix},$$

$$\bar{D}_2 = \begin{bmatrix} D_2 & 0_{p \times \gamma} \\ 0_{p \times v} & I_{p \times \gamma} \end{bmatrix},$$

$$\bar{y}_k = \begin{bmatrix} y_k \\ \gamma_k \end{bmatrix},$$

$$\bar{v}_k = \begin{bmatrix} v_k \\ l_k \end{bmatrix},$$

$$|\bar{v}_k| \le \tilde{\bar{v}},$$

$$\bar{V} = \text{diag}(\tilde{\bar{v}}),$$

$$\bar{f}_k = \begin{bmatrix} f_k \\ 0_\gamma \end{bmatrix},$$

$$\gamma_k \in \tilde{\mathbb{R}}^\gamma;$$

$I_{p+\gamma}$ is a p+γ-order unit matrix, and $\mathbb{R}^\gamma$ represents a γ-dimension real number space;

4.2: expanding the fault vector of the power battery system to the system state vector to obtain the system state variable, and according to Equation (8), obtaining an Equation (9) as follows:

$$\begin{cases} E \bar{x}_{k+1} = \bar{A} \bar{x}_k + \bar{B} u_k + \bar{D}_1 w_k \\ \bar{y}_k = \bar{C}_1 \bar{x}_k + \bar{D}_2 \bar{v}_k \end{cases} \quad (9)$$

where, $$\bar{x}_k = \begin{bmatrix} x_k \\ \bar{f}_k \end{bmatrix},$$

$$E = \begin{bmatrix} I & 0_{n \times (p+\gamma)} \\ 0_{(p+\gamma) \times n} & 0_{p+\gamma} \end{bmatrix},$$

$$\bar{A} = \begin{bmatrix} A & 0_{n \times (p+\gamma)} \\ 0_{(p+\gamma) \times 2} & 0_{p+\gamma} \end{bmatrix},$$

$$\bar{B} = \begin{bmatrix} B \\ 0_{(p+\gamma) \times r} \end{bmatrix},$$

$$\bar{C}_1 = [\bar{C}\ I],$$

$$\bar{D}_1 = \begin{bmatrix} D_1 \\ 0_{(p+\gamma) \times w} \end{bmatrix}.$$

Optionally, the step 5: obtaining the corresponding zonotope set according to the system state variable $\bar{x}_k$ at time k, constructing the zonotope set of the system state variable prediction set $\hat{\bar{\chi}}_{k+1}$ at time k+1 according to the zonotope set of the system state variable $\bar{x}_k$ at time k, and constructing the strip space $S_{k+1}$ at time k+1 according to the system output variable at time k+1, includes:

5.1: constructing the zonotope set of a system state variable feasible set $\hat{\bar{\chi}}_{k+1}$ at time k+1;

setting a zonotope $Z_0 = \bar{p}_0 \oplus \bar{G}_0 \mathbf{B}^s$, corresponding to an initialization state variable $\bar{x}_0$, $\bar{p}_0$ representing a central point of the corresponding zonotope at the initial time, $\bar{G}_0$ representing a shape matrix of the corresponding zonotope at the initial time, $\mathbf{B}^s$ being a unit box composed of s unit intervals $[-1,1]$; assuming a zonotope $Z_k = \bar{p}_k \oplus \bar{G}_k \mathbf{B}^s = \langle \bar{p}_k, \bar{G}_k \rangle$ corresponding to the state variable $\bar{x}_k$ at time k, constructing the zonotope set corresponding to the system state variable prediction set $\hat{\bar{\chi}}_{k+1}$ at time k+1:

$$\hat{\bar{\chi}}_{k+1} \langle \bar{p}_{k+1}, \bar{G}_{k+1} \rangle \quad (10)$$

$$\bar{p}_{k+1} = T\bar{A}\bar{p}_k + T\bar{B}u_k + N\bar{y}_{k+1} \quad (11)$$

$$\bar{G}_{k+1} = [T\bar{A} \downarrow_{re} \bar{G}_k\ T\bar{D}_1 W\ -N\bar{D}_2 \bar{V}] \quad (12)$$

$$T = \Theta^\dagger \alpha_1 + S \Psi \alpha_1, N = \Theta^\dagger \alpha_2 + S \Psi \alpha_2 \quad (13)$$

where, $$\Theta = \begin{bmatrix} E \\ \bar{C}_1 \end{bmatrix},$$

$\Theta^\dagger$ is the pseudo inverse of $\Theta$; $\Psi = I_{n+2p+2\gamma} - \Theta \Theta^\dagger$, $$\alpha_1 = \begin{bmatrix} I_{n+p+\gamma} \\ 0_{(p+\gamma)\times(n+p+\gamma)} \end{bmatrix},$$

$$\alpha_2 = \begin{bmatrix} 0_{(n+p+\gamma)\times(p+\gamma)} \\ I_{n+\gamma} \end{bmatrix},$$

$I_{n+s+r}$ is a n+s+r-order unit matrix; $I_{n+\gamma}$ is an n+γ-order unit matrix; $I_{n+2p+2\gamma}$ is a n+2p+2θ-order unit matrix; $\downarrow_{re}\overline{G}_k \in \mathbb{R}^{n\times q}$ represents a generated matrix after reducing the order of the zonotope of the state at time k, and $\downarrow_{re}\overline{G}_k$ is obtained through Equations (14)-(17):

$$Z = \langle \overline{p}, \overline{G} \rangle \subseteq \overline{p} \oplus rs(\overline{G})\mathbf{B}^n \quad (14)$$

$$rs(\overline{G}) = \begin{bmatrix} \sum_{j=1}^{s}|\overline{G}_{1,j}| & 0 & \cdots & 0 \\ 0 & \sum_{j=1}^{s}|\overline{G}_{2,j}| & \cdots & 0 \\ \vdots & \vdots & \ddots & \vdots \\ 0 & 0 & \cdots & \sum_{j=1}^{s}|\overline{G}_{n,j}| \end{bmatrix} \quad (15)$$

$$Z = \langle \overline{p}, \overline{G} \rangle \subseteq \langle \overline{p}, \downarrow_{re}\overline{G} \rangle \quad (16)$$

$$\downarrow_{re}\overline{G} = \begin{cases} \overline{G}, & s \leq q \\ [\overline{G}_> \ rs(\overline{G}_<)], & s > q \end{cases} \quad (17)$$

where $\overline{G}_>$ is the first q−n columns of a matrix $\overline{G}$ obtained by arranging the column vector of $\overline{G}$ in a descending order according to the Euclidean norm, and $\overline{G}_<$ is the part of $\overline{G}$ with $\overline{G}_>$ removed;

5.2: constructing the strip space $S_{k+1}$ at time k+1 according to the system output variable at time k+1:

$$S_{k+1}=\{\overline{x}_{k+1}\in R^{n+p+\gamma}:|C_1\overline{x}_{k+1}-\overline{y}_{k+1}|\leq \overline{D\overline{v}}\} \quad (18)$$

Optionally, the step 6: solving the intersection of the zonotope set of the system state variable prediction set $\hat{\chi}_{k+1}$ at time k+1 and the constructed strip space $S_{k+1}$ at time k+1, and wrapping with the zonotope of the minimum volume to obtain zonotope set of the system state variable $\overline{x}_{k+1}$ at time k+1, includes:

according to the strip space $S_{k+1}$ at time k+1 and the zonotope set of the state variable prediction set $\hat{\chi}_{k+1}$, in combination with Equations (19)-(22), obtaining the zonotope set of the system state variable $\overline{x}_{k+1}$ at time k+1 by calculation:

$$\overline{x}_{k+1}\in\overline{\chi}_{k+1}=\langle \overline{p}_{k+1},\overline{G}_{k+1}\rangle \quad (19)$$

$$\overline{p}_{k+1}=\overline{p}+L_{k+1}(\overline{y}_{k+1}-C_1\overline{p}_{k+1}) \quad (20)$$

$$\overline{G}_{k+1}=[(I_{n+s+\gamma}-L_{k+1}C_1)\overline{G}_{k+1} L_{k+1}D_v] \quad (21)$$

$$L_{k+1}=\overline{G}_{k+1}\overline{G}_{k+1}^T C_1^T(C_1\overline{G}_{k+1}\overline{G}_{k+1}^T C_1^T+D_v D_v^T)^{-1} \quad (22)$$

where, $D_v=\text{diag}(\overline{D}_2\tilde{v})$.

Optionally, the step 7: acquiring the state estimation interval and the fault estimation interval at time k+1 according to the zonotope set of the system state variable at time k+1, and judging whether the core temperature sensor and the surface temperature sensor in the power battery management system have a fault, includes:

determining the state estimation interval at time k+1 according to Equation (23):

$$\begin{cases} \overline{x}_{k+1}^+(\mu) = \overline{p}_{k+1}(\mu) + \sum_{j=1}^{q}|\overline{G}_{k+1}(\mu,j)|, \mu = 1,\ldots,n+s+\gamma \\ \overline{x}_{k+1}^-(\mu) = \overline{p}_{k+1}(\mu) - \sum_{j=1}^{q}|\overline{G}_{k+1}(\mu,j)|, \mu = 1,\ldots,n+s+\gamma \end{cases} \quad (23)$$

where, $\overline{x}_{k+1}^+(\mu)$, $\overline{x}_{k+1}^-(\mu)$ respectively represent the minimum upper bound and the maximum lower bound of state estimation at time k+1;

determining the fault estimation interval at time k+1 according to Equation (24):

$$f_{k+1}^+=[0_{p\times n}I_p 0_{p\times \gamma}]\overline{x}_{k+1}^+$$

$$f_{k+1}^-=[0_{p\times n}I_p 0_{p\times \gamma}]\overline{x}_{k+1}^- \quad (24)$$

where, $f_{k+1}^+$, $f_{k+1}^-$ respectively represent the minimum upper bound and the maximum lower bound of the fault estimation at time k+1, and $I_p$ is a p-order unit matrix;

if the upper and lower bounds of the fault estimation interval obtained by Equation (24) are on both sides of 0, then a power battery sensor does not have a fault;

if the upper and lower bounds of the fault estimation interval obtained by Equation (24) are on one side of 0 at the same time, the power battery sensor has a fault, and a fault value is within a fault estimation range; at the same time, when fault types are different, fault estimation intervals are different, and the fault type of the power battery sensor is judged according to the fault estimation interval.

Optionally, when the ambient temperature $T_e=25°$ C. and the current is 5 A, the core temperature of the power battery satisfies: $35.8°$ C.$\leq T_c \leq 35.9°$ C.

Optionally, the difference value between the core temperature and the surface temperature of the power battery satisfies: $5.77°$ C.$\leq T_c-T_s \leq 5.87°$ C.

Optionally, $$l_k = \begin{bmatrix} 0.05 \\ 0.05 \end{bmatrix},$$

$$\gamma_k = \begin{bmatrix} -5.82 \\ -35.85 \end{bmatrix},$$

$$H_k = \begin{bmatrix} -1 & 1 \\ -1 & 0 \end{bmatrix}.$$

The present disclosure further provides a power battery system, where the power battery system includes a power battery and a power battery management system, the power battery management system includes a core temperature sensor and a surface temperature sensor for collecting a core temperature and a surface temperature of the power battery, and the power battery system uses the above method to perform fault detection on the core temperature sensor and the surface temperature sensor.

The present disclosure further provides a power battery management system, including a core temperature sensor and a surface temperature sensor for collecting a core temperature and a surface temperature of a power battery, where the power battery management system uses the above method to perform fault detection on the core temperature sensor and the surface temperature sensor.

The present disclosure has the beneficial effects as follows.

The present disclosure provides an uncertain noisy filtering-based fault diagnosis method for a power battery management system. By expanding a state constraint of a power battery to a system output vector of a power battery system, and expanding a fault vector of the power battery system to a system state vector, an augmented system of the power battery system is constructed, a fault estimation interval of the power battery management system is obtained by using a zonotope Kalman filtering method, whether a sensor in the power battery management system has a fault is judged according to upper and lower bounds of fault estimation, and if a fault occurs, a fault type and a fault time are determined according to a result. Compared with an existing fault diagnosis method for a system without a state constraint, the present application solves the problem of fault diagnosis of a system with a state constraint by extending the state constraint of the system to the system output vector.

BRIEF DESCRIPTION OF FIGURES

In order to more clearly illustrate the technical solutions in the examples of the present disclosure, the accompanying drawings which are required to be used in the description of the examples will be simply introduced. It is obvious that the drawings in the description below are only some examples of the present disclosure, and those skilled in the art can also obtain other drawings according to these drawings without involving any inventive effort.

DETAILED DESCRIPTION

Figure 1:
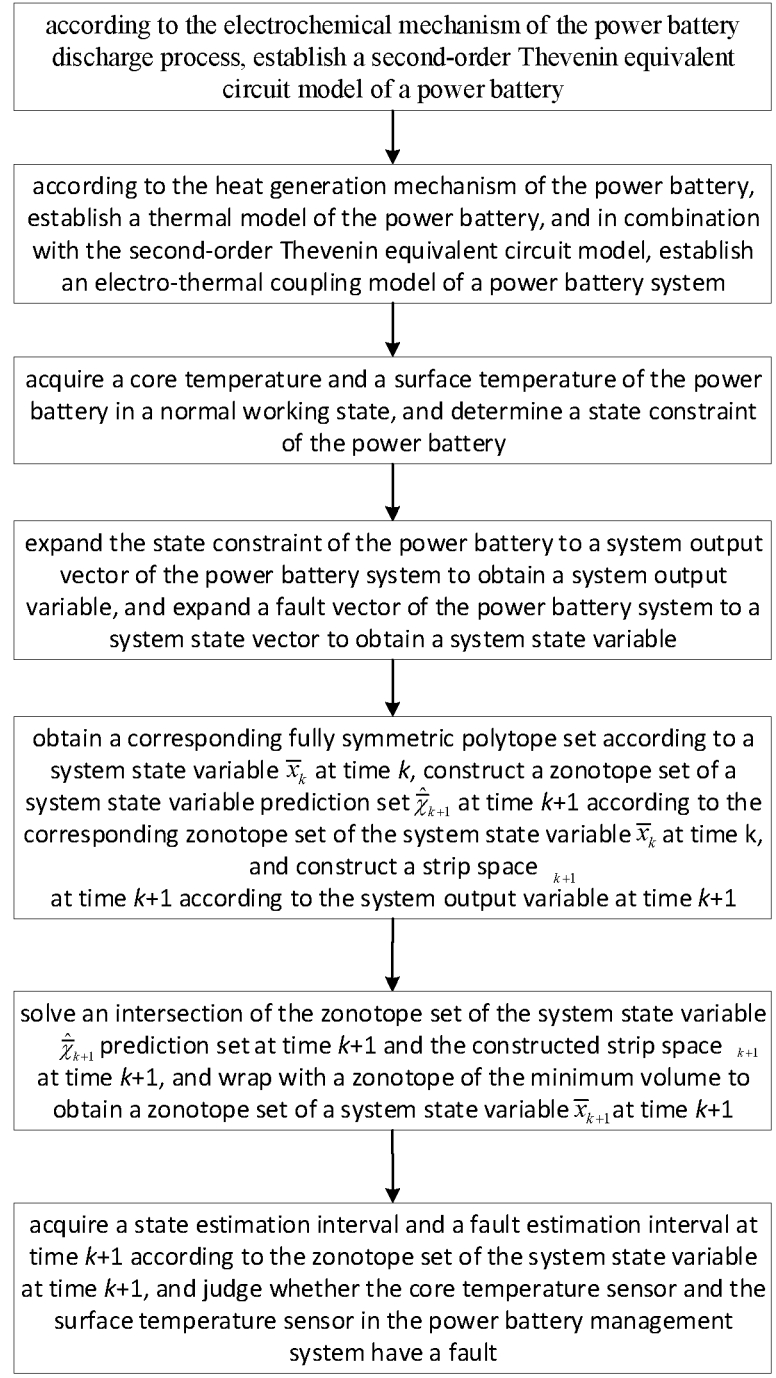
FIG. 1 is a flow diagram of uncertain noisy filtering-based fault diagnosis for a power battery management system disclosed in one example of the present disclosure.

In order to make the objects, technical solutions and advantages of the present disclosure clearer, embodiment of the present disclosure will further be described below in detail with reference to the accompanying drawings.

Example 1

This example provides an uncertain noisy filtering-based fault diagnosis method for a power battery management system, the method is applied in a power battery system, the power battery system includes a power battery and the power battery management system, the power battery management system includes a core temperature sensor and a surface temperature sensor for collecting a core temperature and a surface temperature of the power battery, and the method includes:

step 1: according to the electrochemical mechanism of the power battery discharge process, establishing a second-order Thevenin equivalent circuit model of a power battery;

step 2: according to the heat generation mechanism of the power battery, establishing a thermal model of the power battery, and in combination with the second-order Thevenin equivalent circuit model, establishing an electro-thermal coupling model of the power battery system;

step 3: acquiring a core temperature and a surface temperature of the power battery in a normal working state, and determining a state constraint of the power battery;

step 4: expanding the state constraint of the power battery to a system output vector of the power battery system to obtain a system output variable, and expanding a fault vector of the power battery system to a system state vector to obtain a system state variable;

the system output vector being a vector composed of the core temperature and the surface temperature collected by the core temperature sensor and the surface temperature sensor; the fault vector being a vector formed by fault values of the core temperature sensor and the surface temperature sensor; the system state vector referring to a vector composed of an actual core temperature and an actual surface temperature of the power battery;

step 5: obtaining a corresponding zonotope set according to a system state variable $\bar{x}_k$ at time k, constructing a zonotope set of a system state variable prediction set $\hat{\chi}_{k+1}$ at time k+1 according to the corresponding zonotope set of the system state variable $\bar{x}_k$ at time k, and constructing a strip space $S_{k+1}$ at time k+1 according to the system output variable at time k+1;

step 6: solving an intersection of the zonotope set of the system state variable prediction set $\hat{\chi}_{k+1}$ at time k+1 and the constructed strip space $S_{k+1}$ at time k+1, and wrapping with a zonotope of the minimum volume to obtain a zonotope set of a system state variable $\bar{x}_{k+1}$ at time k+1; and step 7: acquiring a state estimation interval and a fault estimation interval at time k+1 according to the zonotope set of the system state variable at time k+1, and judging whether the core temperature sensor and the surface temperature sensor in the power battery management system have a fault.

Example 2

Figure 2:
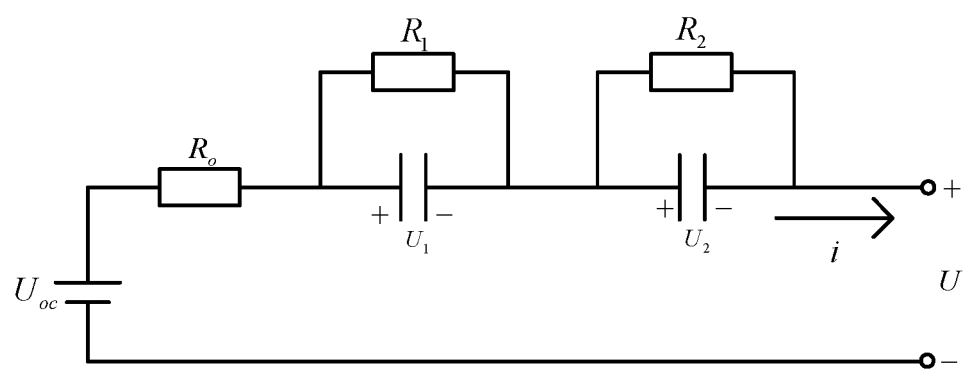
FIG. 2 is an equivalent circuit model diagram of a power battery.

The present disclosure provides an uncertain noisy filtering-based fault diagnosis method for a power battery management system, and referring to FIG. 1, the method includes:

step 1: according to the electrochemical mechanism of the power battery discharge process, establishing a second-order Thevenin equivalent circuit model of a power battery:

the second-order Thevenin equivalent circuit diagram of the power battery being as shown in FIG. 2, wherein, U is a voltage at two ends of the battery, $U_{oc}$ is the internal voltage of the battery, $R_1$ and $C_{p1}$ are respectively electrochemical polarization internal resistance and capacitance, and a voltage at the two ends thereof is $U_1$. $R_2$ and $C_{p2}$ are respectively concentration polarization resistance and capacitance, and a voltage at the two ends thereof is $U_2$. i is a discharge current. $R_o$ is the internal resistance of the battery.

Establishing equations as follows according to the electrochemical mechanism of the power battery discharge process:

$$U = U_\infty - R_o i - U_1 - U_2 \tag{1}$$

$$\begin{cases} \dot{U}_1 = -\dfrac{1}{R_1 C_{p1}} U_1 + \dfrac{1}{C_{p1}} i \\ \dot{U}_2 = -\dfrac{1}{R_2 C_{p2}} U_2 + \dfrac{1}{C_{p2}} i \end{cases}$$

Step 2: according to the heat generation mechanism of the power battery, establishing a thermal model of the power battery, and in combination with the second-order Thevenin equivalent circuit model, establishing an electro-thermal coupling model of the power battery;

according to the heat generation mechanism of the power battery, establishing the thermal model of the power battery:

$$\begin{cases} C_c \dot{T}_c = Q_{gen} + \dfrac{T_s - T_c}{R_c} \\ C_s \dot{T}_s = \dfrac{T_e - T_s}{R_u} - \dfrac{T_s - T_c}{R_c} \end{cases} \tag{2}$$

where $T_s$ and $T_c$ represent the battery surface temperature and the battery core temperature respectively, and $T_e$ represents an ambient temperature. $C_s$ and $C_c$ respectively represent a heat capacity coefficient of a material inside the battery and a heat capacity coefficient of the surface of the battery. $R_c$ represents a thermal resistance between the core and the surface of the battery, and $R_u$ represents a convection resistance between the surface of the battery and cooling air. $Q_{gen}$ represents the heating power of the core of the battery, and can be obtained through the second-order Thevenin equivalent circuit model of the power battery:

$$Q_{gen} = i(U_{oc} - U) = i(R_o i + U_1 + U_2) \tag{3}$$

where, $U_1$ and $U_2$ are determined by Equation (1).

In combination with the second-order Thevenin equivalent circuit model, establishing the electro-thermal coupling model of the power battery system, taking the heating power $Q_{gen}$ of the core of the battery and the ambient temperature $T_e$ as the input of the electro-thermal coupling model, taking the surface temperature $T_s$ and the core temperature $T_c$ as the state vector of the electro-thermal coupling model, setting a sampling time interval as $\Delta ts$, discretizing Equation (2), and adding a disturbance noise to obtain the state equation of the electro-thermal coupling model:

$$X_{k+1} = A X_k + B u_k + D_1 w_k \tag{4}$$

where, $x_k \in \mathbb{R}^n$ is the system state vector, $\mathbb{R}^n$ represents an n-dimensional real number space, $x_k = [T_{c,k}, T_{s,k}]^T$, $T_{c,k}$ and $T_{s,k}$ respectively represent real values of the core temperature and the surface temperature of the battery at time k, and T represents transposing operation of a matrix; $u_k \in \mathbb{R}^r$ is a system input matrix at time k, r represents the dimension of $u_k$, $u_k = [(q_{gen,k}, T_{e,k})]^T$; $w_k \in \mathbb{R}^w$ represents an unknown but bounded disturbance noise, $\tilde{w}$ is a boundary value; $|w_k| \leq \tilde{w}$;

$$A = \begin{bmatrix} 1 - \dfrac{\Delta t}{R_c C_c} & \dfrac{\Delta t}{R_c C_c} \\ \dfrac{\Delta t}{R_c C_s} & 1 - \dfrac{\Delta t}{R_c C_s} - \dfrac{\Delta t}{R_u C_s} \end{bmatrix}$$

represents a state space matrix;

$$B = \begin{bmatrix} \dfrac{\Delta t}{C_c} & 0 \\ 0 & \dfrac{\Delta t}{R_u C_s} \end{bmatrix}$$

represents an input matrix;

$$D_1 = \begin{bmatrix} 1 & 0 \\ 0 & 1 \end{bmatrix}$$

represents a disturbance action matrix;

taking measured values of the surface temperature $T_s$ and the core temperature $T_c$ as the output of the electro-thermal coupling model, and adding a measurement noise and a sensor fault vector at the same time to obtain the output equation of the electro-thermal coupling model:

$$y_k = C x_k + D_2 v_k + f_k \tag{5}$$

where, $y_k \in \mathbb{R}^p$ is the system output vector, $\mathbb{R}^p$ represents a p-dimensional real number space, $y_k = [T_{c,k}', T_{s,k}']^T$, $T_{c,k}'$ and $T_{s,k}'$ respectively represent measured values of the core temperature and the surface temperature of the battery; $v_k \in \mathbb{R}^v$ represents an unknown but bounded measurement noise, i.e., $$|v_k| \leq \tilde{v}; \quad C = \begin{bmatrix} 1 & 0 \\ 0 & 1 \end{bmatrix}$$

represents an output matrix, and $$D_2 = \begin{bmatrix} 1 & 0 \\ 0 & 1 \end{bmatrix}$$

represents a measurement noise action matrix; $f_k \in [f_{1,k}, f_{2,k}]^T \in \mathbb{R}^p$ represents a sensor fault of the power battery, $f_{1,k}$ represents a core temperature sensor fault of the power battery, and $f_{2,k}$ represents a surface temperature sensor fault of the power battery;

according to Equation (4) and Equation (5), establishing the electro-thermal coupling model of the power battery system as:

$$\begin{cases} x_{k+1} = A x_k + B u_k + D_1 w_k \\ y_k = C x_k + D_2 v_k + f_k \end{cases} \tag{6}$$

Step 3: acquiring a core temperature and a surface temperature of the power battery in a normal working state, and determining a state constraint of the system:

when the power battery works under a normal working condition, the core temperature $T_c$ satisfies $M_1^\circ C. \leq T \leq M_2^\circ C.$; there is a difference value between the core temperature and the surface temperature, and the difference value is stabilized within a range of $m^\circ C. \pm \varepsilon^\circ C.$, namely $m - \varepsilon^\circ C. \leq T_c - T_s \leq m + \varepsilon^\circ C.$;

determining the state constraint of the system:

$$\begin{cases} |T_{c,k} - T_{s,k} - m| \leq \varepsilon \\ \left| T_{c,k} - \dfrac{M_1 + M_2}{2} \right| \leq \dfrac{M_2 - M_1}{2} \end{cases}$$

writing the state constraint of the system into the form of Equation (7):

$$|\gamma_k - H_k x_k| \leq l_k, \ h(x_k) = \gamma_k - H_k x_k \quad (7)$$

where, $$l_k = \begin{bmatrix} \varepsilon \\ \frac{M_2 - M_1}{2} \end{bmatrix}, \ \gamma_k = \begin{bmatrix} -m \\ -\frac{M_2 - M_1}{2} \end{bmatrix}, \ H_k = \begin{bmatrix} -1 & 1 \\ -1 & 0 \end{bmatrix}.$$

In actual application, when the current is 5 A and the ambient temperature is ° C., the power battery works under the normal working condition, the core temperature will be stabilized in the range of [35.8° C.,35.9° C.], namely, 35.8° C.$\leq T_c \leq$35.9° C. There is also a difference value between the core temperature and the surface temperature, the difference value will be stabilized in the range of 5.82° C.±0.05° C., namely, 5.77° C.$\leq T_c - T_s \leq$5.87° C.

Therefore, $$l_k = \begin{bmatrix} 0.05 \\ 0.05 \end{bmatrix}, \ \gamma_k = \begin{bmatrix} -5.82 \\ -35.85 \end{bmatrix}, \ H_k = \begin{bmatrix} -1 & 1 \\ -1 & 0 \end{bmatrix}.$$

Step 4: expanding the state constraint of the power battery to a system output vector of the power battery system to obtain a system output variable, and expanding a fault vector of the power battery system to a system state vector to obtain a system state variable;

expanding the state constraint of the power battery to the system output vector of the power battery system, and according to Equation (6) and Equation (7), obtaining an Equation (8) as follows:

$$\begin{cases} x_{k+1} = Ax_k + Bu_k + D_1 w_k \\ \bar{y}_k = \bar{C} x_k + \bar{D}_2 \bar{v}_k + \bar{f}_k \end{cases} \quad (8)$$

where, $\bar{C} = \begin{bmatrix} C \\ H_k \end{bmatrix}, \ \bar{D}_2 = \begin{bmatrix} D_2 & 0_{p \times \gamma} \\ 0_{p \times v} & I_{p \times \gamma} \end{bmatrix}, \ \bar{y}_k = \begin{bmatrix} y_k \\ \gamma_k \end{bmatrix},$ $$\bar{v}_k = \begin{bmatrix} v_k \\ l_k \end{bmatrix}, \ |\bar{v}_k| \leq \tilde{v} -, \ \bar{V} = \text{diag}(\tilde{v}), \ \bar{f}_k = \begin{bmatrix} f_k \\ 0_\gamma \end{bmatrix}, \ \gamma_k \in \mathscr{K}.$$

Expanding the fault vector of the power battery system to the system state vector to obtain the system state variable, and according to Equation (8), obtaining an Equation (9) as follows:

$$\begin{cases} E \bar{x}_{k+1} = \bar{A} \bar{x}_k + \bar{B} u_k + \bar{D}_1 w_k \\ \bar{y}_k = C_1 \bar{x}_k + \bar{D}_2 \bar{v}_k \end{cases} \quad (9)$$

where, $\bar{x}_k = \begin{bmatrix} x_k \\ f_k \end{bmatrix}, \ E = \begin{bmatrix} I & 0_{n \times (p+\gamma)} \\ 0_{(p+\gamma) \times n} & 0_{p+\gamma} \end{bmatrix}, \ \bar{A} = \begin{bmatrix} A & 0_{n \times (p+\gamma)} \\ 0_{(p+\gamma) \times 2} & 0_{p+\gamma} \end{bmatrix},$ $$\bar{B} = \begin{bmatrix} B \\ 0_{(p+\gamma) \times r} \end{bmatrix}, \ C_1 = [\bar{C} \ I], \ \bar{D}_1 = \begin{bmatrix} D_1 \\ 0_{(p+\gamma) \times w} \end{bmatrix}.$$

Step 5: obtaining a corresponding zonotope set according to a system state variable $\bar{x}_k$ at time k, constructing a zonotope set of a system state variable prediction set $\hat{\bar{\chi}}_{k+1}$ at time k+1 according to the zonotope set of the system state variable $\bar{x}_k$ at time k, and constructing a strip space $S_{k+1}$ at time k+1 according to the system output variable:

constructing the zonotope set of a system state variable feasible set $\hat{\bar{\chi}}_{k+1}$ at time k+1;

setting a zonotope $Z_0 = \bar{p}_0 \oplus \bar{G}_0 \mathbf{B}^s$, corresponding to an initialization state variable $\bar{x}_0$, $\bar{p}_0$ representing a central point of the corresponding zonotope at the initial time, $\bar{G}_0$ representing a shape matrix of the corresponding zonotope at the initial time, and $\mathbf{B}^s$ being a unit box composed of s unit intervals $[-1,1]$;

assuming a zonotope $Z_k = \bar{p}_k \oplus \bar{G}_k \mathbf{B}^s = \langle \bar{p}_k, \bar{G}_k \rangle$ corresponding to the state variable $\bar{x}_k$ at time k, then constructing the zonotope set corresponding to the system state variable prediction set $\hat{\bar{\chi}}_{k+1}$ at time k+1

$$\hat{\bar{\chi}}_{k+1} \langle \bar{p}_{k+1}, \bar{G}_{k+1} \rangle \quad (10)$$

$$\bar{p}_{k+1} = T \bar{A} p_k + T \bar{B} u_k + N \bar{y}_{k+1} \quad (11)$$

$$\bar{G}_{k+1} = [T \bar{A} \downarrow_{re} \bar{G}_k T \bar{D}_1 W - N \bar{D}_2 \bar{V}] \quad (12)$$

$$T = \Theta^\dagger \alpha_1 + S \Psi \alpha_1, \ N = \Theta^\dagger \alpha_2 + S \Psi \alpha_2 \quad (13)$$

where, $$\Theta = \begin{bmatrix} E \\ C_1 \end{bmatrix},$$

$\Theta^\dagger$ is the pseudo inverse of $\Theta$; $\Psi = I_{n+2p+2\gamma} \Theta \Theta^\dagger$, $$\alpha_1 = \begin{bmatrix} I_{n+p+\gamma} \\ 0_{(p+\gamma) \times (n+p+\gamma)} \end{bmatrix}, \ \alpha_2 = \begin{bmatrix} 0_{(n+p+\gamma) \times (p+\gamma)} \\ I_{n+\gamma} \end{bmatrix}. \downarrow_{re} \bar{G}_k \in \mathbb{R}^{n \times q}$$

represents a generated matrix after reducing the order of the zonotope of the state at time k, and $\downarrow_{re} \bar{G}_k$ is obtained through Equations (14)-(17):

$$Z = \langle p, \bar{G} \rangle \subseteq \bar{p} \oplus rs(\bar{G}) \mathbf{B}^n \quad (14)$$

$$rs(\bar{G}) = \begin{bmatrix} \sum_{j=1}^s |\bar{G}_{1,j}| & 0 & \cdots & 0 \\ 0 & \sum_{j=1}^s |\bar{G}_{2,j}| & \cdots & 0 \\ \vdots & \vdots & \ddots & \vdots \\ 0 & 0 & \cdots & \sum_{j=1}^s |\bar{G}_{n,j}| \end{bmatrix} \quad (15)$$

$$Z = \langle \bar{p}, \bar{G} \rangle \subseteq \langle \bar{p}, \downarrow_{re} \bar{G} \rangle \quad (16)$$

$$\downarrow_{re} \bar{G} = \begin{cases} \bar{G}, & s \leq q \\ [\bar{G}_> \ rs(\bar{G}_<)], & s > q \end{cases} \quad (17)$$

where $\bar{G}_>$ is the first q−n columns of a matrix $\tilde{G}$ obtained by arranging the column vector of $\bar{G}$ in a descending order according to the Euclidean norm, and $\bar{G}_<$ is the part of $\tilde{G}$ with $\bar{G}_>$ removed.

Constructing the strip space $S_{k+1}$ at time k+1 according to the system output variable at time k+1:

$$S_{k+1} = \{\bar{x}_{k+1} \in R^{n+p+\gamma} : |C_1 \bar{x}_{k+1} - \bar{y}_{k+1}| \leq \overline{D \bar{v}}\} \quad (18)$$

Step 6: solving an intersection of the zonotope set of the system state variable prediction set $\hat{\bar{\chi}}_{k+1}$ at time k+1 and the constructed strip space $S_{k+1}$, and wrapping with a zonotope of the minimum volume to obtain a zonotope set of a state variable $\bar{x}_{k+1}$ at time k+1;

according to the strip space $S_{k+1}$ at time k+1 and the zonotope set of the state variable prediction set $\hat{\bar{\chi}}_{k+1}$, in combination with Equations (19)-(22), obtaining the zonotope set of the state variable $\bar{x}_{k+1}$ at time k+1 by calculation.

$$\bar{x}_{k+1} \in \bar{\chi}_{k+1} = \langle \bar{p}_{k+1}, \bar{G}_{k+1} \rangle \tag{19}$$

$$\bar{p}_{k+1} = \bar{p} + L_{k+1}(\bar{y}_{k+1} - C_1 \bar{p}_{k+1}) \tag{20}$$

$$\bar{G}_{k+1} = [(I_{n+s+\gamma} - L_{k+1} C_1)\bar{G}_{k+1} L_{k+1} D_v] \tag{21}$$

$$L_{k+1} = \bar{G}_{k+1} \bar{G}_{k+1}{}^T C_1{}^T (C_1 \bar{G}_{k+1} \bar{G}_{k+1}{}^T C_1{}^T + D_v D_v{}^T)^{-1} \tag{22}$$

where, $D_v = \text{diag}(\bar{D}_2 \bar{v})$.

Step 7: acquiring a state estimation interval and a fault estimation interval at time k+1 according to the zonotope set of the system state variable at time k+1, and judging whether the core temperature sensor and the surface temperature sensor in the power battery management system have a fault:

determining the state estimation interval at time k+1 according to Equation (23):

$$\begin{cases} \bar{x}_{k+1}^+(\mu) = \bar{p}_{k+1}(\mu) + \sum_{j=1}^{q}|\bar{G}_{k+1}(\mu, j)|, \mu = 1, \ldots, n+s+\gamma \\ \bar{x}_{k+1}^-(\mu) = \bar{p}_{k+1}(\mu) - \sum_{j=1}^{q}|\bar{G}_{k+1}(\mu, j)|, \mu = 1, \ldots, n+s+\gamma \end{cases} \tag{23}$$

where, $\bar{x}_{k+1}{}^+(\mu)$, $\bar{x}_{k+1}{}^-(\mu)$ respectively represent the minimum upper bound and the maximum lower bound of state estimation at time k+1;

determining the fault estimation interval at time k+1 according to Equation (24):

$$f_{k+1}{}^+ = [0_{p \times n} I_p 0_{p \times \gamma}] \bar{x}_{k+1}{}^+$$

$$f_{k+1}{}^- = [0_{p \times n} I_p 0_{p \times \gamma}] \bar{x}_{k+1}{}^- \tag{24}$$

where, $f_{k+1}{}^+$, $f_{k+1}{}^-$ respectively represent the minimum upper bound and the maximum lower bound of the fault estimation at time k+1.

If the upper and lower bounds of the fault estimation interval obtained by Equation (24) are on both sides of 0, then a power battery sensor does not have a fault. If the upper and lower bounds of the fault estimation interval are on one side of 0 at the same time, it shows that the power battery sensor has a fault, and a fault value is within a fault estimation range; at the same time, when fault types are different, fault estimation intervals are different, and the fault type of the power battery sensor is judged according to the fault estimation interval.

In order to verify the accuracy and rapidity of the uncertain noisy filtering-based fault diagnosis method for the power battery proposed in the present application, the following simulation experiments are performed: for the power battery system in the normal working state, it is set that two different sensor faults occur during the time period k∈ {300, 2000} and k∈ {500, 2000}.

Figure 3:
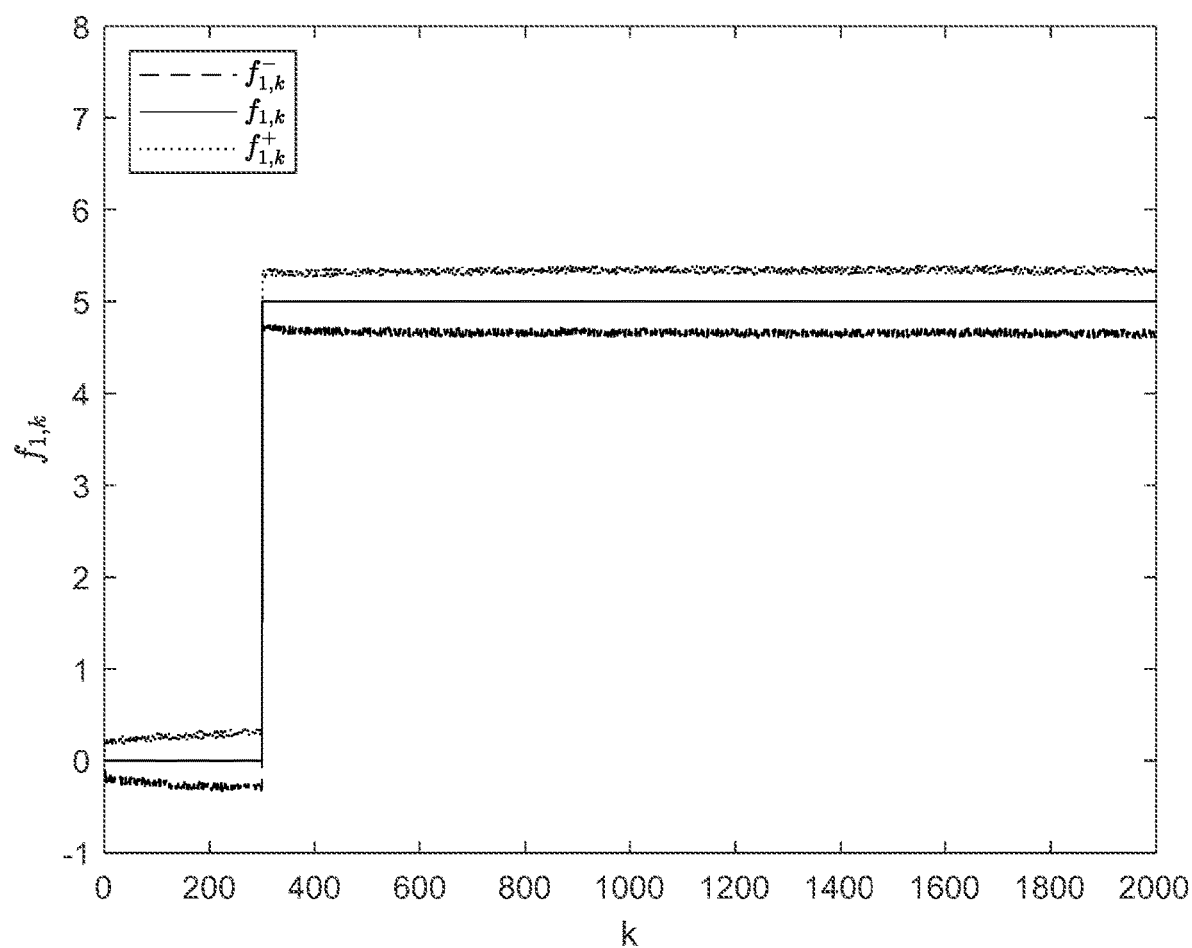
FIG. 3 is a relation diagram of upper and lower bounds (the upper bound being a dotted line and the lower bound being a dashed line) of fault estimation of the present disclosure and an applied fault value (solid line) when a core temperature sensor fault signal f is applied to a power battery disclosed in one example of the present disclosure.
Figure 4:
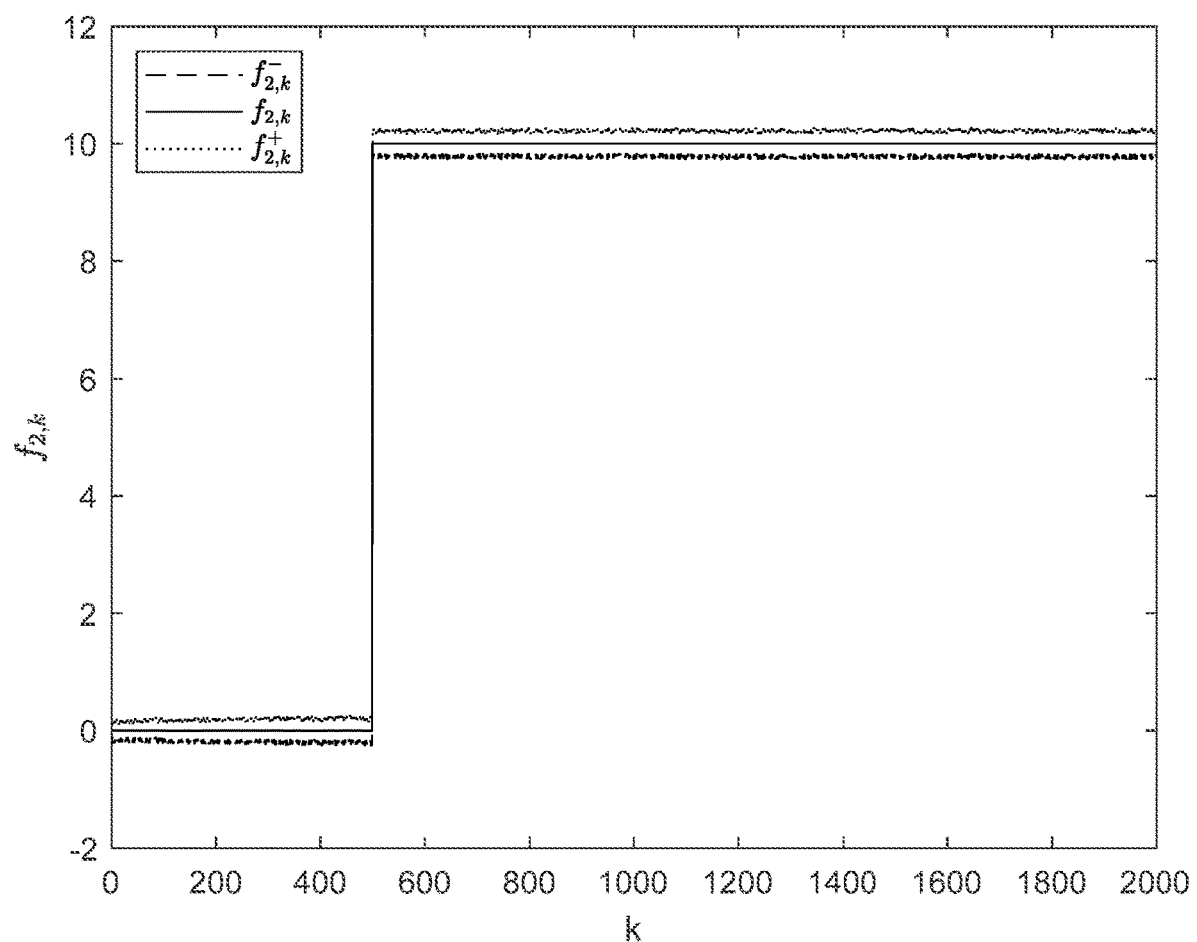
FIG. 4 is a relation diagram of upper and lower bounds (the upper bound being a dotted line and the lower bound being a dashed line) of fault estimation of the present disclosure and an applied fault value (solid line) when a surface temperature sensor fault signal $f_2$ is applied to a power battery disclosed in one example of the present disclosure.

FIG. 3 and FIG. 4 respectively show the changes of the upper and lower bounds of estimation of two types of sensor faults. It can be seen from FIG. 3 that when k∈ {0, 300}, the upper and lower bounds of the fault estimation interval are on both sides of 0, and then the system also has no fault signal; when k∈ {300, 2000}, the fault estimation interval is on both sides of an applied fault signal, and by this time, a fault signal $f_1$ is applied to the system. It can be seen from FIG. 4 that when k∈ {0, 500}, the upper and lower bounds of the fault estimation interval are on both sides of 0, and then the system also has no fault signal; and when k∈ {500, 2000}, the fault estimation interval is on both sides of the applied fault signal, and by this time, a fault signal $f_2$ is applied to the system. It shows that the fault diagnosis method provided in the present disclosure has the features of high fault detection efficiency and accurate fault diagnosis.

Some of the steps in the examples of the present disclosure may be implemented using software, and the corresponding software program may be stored in a readable storage medium, such as an optical disk or a hard disk.

The above descriptions are only preferred examples of the present disclosure, and are not intended to limit the present disclosure. Any modification, equivalent replacement, improvement, etc. made within the spirit and principle of the present disclosure shall be included in the protection range of the present disclosure.

What is claimed is:

1. An uncertain noisy filtering-based fault diagnosis method for a power battery management system, wherein the method comprises:

step 1: according to an electrochemical mechanism of the power battery discharge process, establishing a second-order Thevenin equivalent circuit model of a power battery;

step 2: according to a heat generation mechanism of the power battery, establishing a thermal model of the power battery, and in combination with the second-order Thevenin equivalent circuit model, establishing an electro-thermal coupling model of a power battery system;

step 3: acquiring a core temperature and a surface temperature of the power battery in a normal working state, and determining a state constraint of the power battery;

step 4: expanding the state constraint of the power battery to a system output vector of the power battery system to obtain a system output variable, and expanding a fault vector of the power battery system to a system state vector to obtain a system state variable;

the system output vector being a vector composed of the core temperature and the surface temperature collected by a core temperature sensor and a surface temperature sensor; the fault vector being a vector formed by fault values of the core temperature sensor and the surface temperature sensor; the system state vector referring to a vector composed of an actual core temperature and an actual surface temperature of the power battery;

step 5: obtaining a zonotope set according to a system state variable at time k, constructing a zonotope set of a system state variable prediction set at time k+1 according to the corresponding zonotope set of the system state variable at time k, and constructing a strip space at time k+1 according to the system output variable at time k+1;

step 6: solving an intersection of the zonotope set of the system state variable prediction set $\hat{X}_{k+1}$ at time k+1 and the constructed strip space $S_{k+1}$ at time k+1, and wrapping with a zonotope of the minimum volume to obtain a zonotope set of a system state variable $\bar{X}_{k+1}$ at time k+1;

step 7: acquiring a state estimation interval and a fault estimation interval at time k+1 according to the zonotope set of the system state variable at time k+1, and judging whether the core temperature sensor and the surface temperature sensor in the power battery management system have a fault;

wherein the power battery system comprises the power battery and the power battery management system, and the power battery management system comprises the core temperature sensor and the surface temperature sensor for collecting the core temperature and the surface temperature of the power battery.

2. The method according to claim 1, wherein the step 3: acquiring the core temperature and the surface temperature of the power battery in the normal working state, and determining the state constraint of the power battery, comprising:

acquiring the core temperature and the surface temperature of the power battery in the normal working state, and determining a state constraint of the system:

when the power battery works under a normal working condition, the core temperature $T_c$ satisfies $M_1°C. \leq T_c \leq M_2°C.$; there is a difference value between the core temperature and the surface temperature, and the difference value is stabilized within a range of $m°C. \pm \varepsilon°C.$, namely $m-\varepsilon°C. \leq T_c - T_s \leq m+\varepsilon°C.$;

determining the state constraint of the system:

$$\begin{cases} |T_{c,k} - T_{s,k} - m| \leq \varepsilon \\ \left| T_{c,k} - \frac{M_1 + M_2}{2} \right| \leq \frac{M_2 - M_1}{2} \end{cases}$$

writing the state constraint of the system into the form of Equation (7):

$$|\gamma_k - H_k x_k| \leq l_k, \ h(x_k) = \gamma_k - H_k x_k \text{ where,} \quad (7)$$

$$l_k = \begin{bmatrix} \varepsilon \\ \frac{M_2 - M_1}{2} \end{bmatrix}, \gamma_k = \begin{bmatrix} -m \\ -\frac{M_1 + M_2}{2} \end{bmatrix}, H_k = \begin{bmatrix} -1 & 1 \\ -1 & 0 \end{bmatrix}.$$

3. The method according to claim 2, wherein, the step 1: according to the electrochemical mechanism of the power battery discharge process, establishing the second-order Thevenin equivalent circuit model of the power battery, comprises:

establishing equations as follows according to the electrochemical mechanism of the power battery discharge process:

$$U = U_{oc} - R_o i - U_1 - U_2 \quad (1)$$

$$\begin{cases} \dot{U}_1 = -\frac{1}{R_1 C_{p1}} U_1 + \frac{1}{C_{p1}} i \\ \dot{U}_2 = -\frac{1}{R_2 C_{p2}} U_2 + \frac{1}{C_{p2}} i \end{cases}$$

where, U is a voltage at two ends of the battery, $U_{oc}$ is the internal voltage of the battery, $R_1$ and $C_{p1}$ are respectively electrochemical polarization internal resistance and capacitance, and a voltage at the two ends after $R_1$ and $C_{p1}$ are connected in parallel is $U_1$; $R_2$ and $C_{p2}$ are respectively concentration polarization resistance and capacitance, and a voltage at the two ends after $R_2$ and $C_{p2}$ are connected in parallel is $U_2$; i is a discharge current; $R_o$ is the internal resistance of the battery.

4. The method according to claim 3, wherein, the step 2: according to the heat generation mechanism of the power battery, establishing the thermal model of the power battery, and in combination with the second-order Thevenin equivalent circuit model of the power battery, establishing the electro-thermal coupling model of the power battery, comprises:

2.1: according to the heat generation mechanism of the power battery, establishing the thermal model of the power battery:

$$\begin{cases} C_c \dot{T}_c = Q_{gen} + \frac{T_s - T_c}{R_c} \\ C_s \dot{T}_s = \frac{T_e - T_s}{R_u} - \frac{T_s - T_c}{R_c} \end{cases} \quad (2)$$

where $T_s$ and $T_c$ represent the battery surface temperature and the battery core temperature respectively, and $T_e$ represents an ambient temperature; $C_s$ and $C_c$ respectively represent a heat capacity coefficient of a material inside the battery and a heat capacity coefficient of the surface of the battery; $R_c$ represents a thermal resistance between the core and the surface of the battery; $R_u$ represents a convection resistance between the surface of the battery and cooling air; $Q_{gen}$ represents the heating power of the core of the battery:

$$Q_{gen} = i(U_{oc} - U) = i(R_o i + U_1 + U_2) \quad (3)$$

2.2: in combination with the second-order Thevenin equivalent circuit model, establishing the electro-thermal coupling model of the power battery system, taking the heating power $Q_{gen}$ of the core of the battery and the ambient temperature $T_e$ as the input of the electro-thermal coupling model, taking the surface temperature $T_s$ and the core temperature $T_c$ as the state vector of the electro-thermal coupling model, setting a sampling time interval as $\Delta t$ s, discretizing Equation (2), and adding a disturbance noise to obtain the state equation of the electro-thermal coupling model:

$$X_{k+1} = AX_k + Bu_k + D_1 w_k \quad (4)$$

where, $x_k \in \mathbb{R}^n$ is the system state vector, $\mathbb{R}$ represents an n-dimensional real number space, $x_k = [T_{c,k}, T_{s,k}]^T$, $T_{c,k}$ and $T_{s,k}$ respectively represent real values of the core temperature and the surface temperature of the battery at time k; $u_k \in \mathbb{R}^r$ is a system input matrix at time k; $u_k = [Q_{gen,k}, T_{e,k}]^T$, $w_k \in \mathbb{R}^w$ represents an unknown but bounded disturbance noise, $\tilde{w}$ is a boundary value; $|\leq \tilde{w}$; A=

$$A = \begin{bmatrix} 1 - \frac{\Delta t}{R_c C_c} & \frac{\Delta t}{R_c C_c} \\ \frac{\Delta t}{R_c C_s} & 1 - \frac{\Delta t}{R_c C_s} - \frac{\Delta t}{R_u C_s} \end{bmatrix}$$

represents a state space matrix; B=

$$B = \begin{bmatrix} \frac{\Delta t}{C_c} & 0 \\ 0 & \frac{\Delta t}{R_u C_s} \end{bmatrix}$$

represents a disturbance action matrix; $D_1$=

$$D_1 = \begin{bmatrix} 1 & 0 \\ 0 & 1 \end{bmatrix}$$

represents an input matrix;

taking measured values of the surface temperature $T_s$ and the core temperature $T_c$ as the output of the electro-thermal coupling model, and adding a measurement noise and a sensor fault vector at the same time to obtain the output equation of the electro-thermal coupling model $$y_k = Cx_k + D_2 v_k + f_k \quad (5)$$

where, $y_k \in \mathbb{R}^p$ is the system output vector, $\mathbb{R}^p$ represents a p-dimensional real number space, $y_k = [T'_{c,k}, T'_{s,k}]T$, $T'_{c,k}$ and $T'_{s,k}$ respectively represent measured values of the core temperature and the surface temperature of the battery; $v_k \in \mathbb{R}^v$ represents an unknown but bounded measurement noise, $\mathbb{R}^v$ represents a v-dimensional real number space, and $\tilde{v}$ is a boundary value, $|c_k| \leq \tilde{v}$; C=

$$C = \begin{bmatrix} 1 & 0 \\ 0 & 1 \end{bmatrix}$$

represents an output matrix, and $$D_2 = \begin{bmatrix} 1 & 0 \\ 0 & 1 \end{bmatrix}$$

represents a measurement noise action matrix; $f_k = [f_{1,k}, f_{2,k}]^T \in \mathbb{R}^p$ represents a sensor fault of the power battery, $f_{1,k}$ represents a core temperature sensor fault of the power battery, and $f_{2,k}$ represents a surface temperature sensor fault of the power battery;

according to Equation (4) and Equation (5), establishing the electro-thermal coupling model of the power battery system as:

$$\begin{cases} x_{k+1} = A x_k + B u_k + D_1 w_k \\ y_k = C x_k + D_2 u_k + f_k \end{cases} \quad (6)$$

5. The method according to claim 4, wherein, the step 4: expanding the state constraint of the power battery to the system output vector of the power battery system to obtain the system output variable, and expanding the fault vector of the power battery system to the system state vector to obtain the system state variable, comprises:

4.1: expanding the state constraint of the power battery to the system output vector of the power battery system to obtain the system output variable, and according to Equation (6) and Equation (7), obtaining an Equation (8) as follows:

$$\begin{cases} x_{k+1} = A x_k + B u_k + D_1 w_k \\ \overline{y}_k = \overline{C} x_k + \overline{D}_2 \overline{v}_k + \overline{f}_k \end{cases} \text{ where, } \overline{C} = \begin{bmatrix} C \\ H_k \end{bmatrix}, \quad (8)$$

$$\overline{D}_2 = \begin{bmatrix} D_2 & 0_{p \times \gamma} \\ 0_{p \times v} & I_{p \times \gamma} \end{bmatrix}, \overline{y}_k = \begin{bmatrix} y_k \\ \gamma_k \end{bmatrix}, \overline{v}_k = \begin{bmatrix} v_k \\ l_k \end{bmatrix}, |\overline{v}_k| \leq \tilde{v}, \overline{V} = \text{diag}(\tilde{v}),$$

$$\overline{f}_k = \begin{bmatrix} f_k \\ 0_\gamma \end{bmatrix},$$

$\gamma_k \in \mathbb{R}^\gamma$; $I_{p+\gamma}$ is a p+γ-orde unit matrix, and $\mathbb{R}^\gamma$ represents a γ-dimension real mnumber space;

4.2: expanding the fault vector of the power battery system to the system state vector to obtain the system state variable, and according to Equation (8), obtaining an Equation (9) as follows:

$$\begin{cases} E \overline{x}_{k+1} = \overline{A} \overline{x}_k + \overline{B} u_k + \overline{D}_1 w_k \\ \overline{y}_k = C_1 \overline{x}_k + \overline{D}_2 \overline{v}_k \end{cases} \text{ where, } \overline{x}_k = \begin{bmatrix} x_k \\ f_k \end{bmatrix}, \quad (9)$$

$$E = \begin{bmatrix} I & 0_{n \times (p+\gamma)} \\ 0_{(p+\gamma) \times n} & 0_{p+\gamma} \end{bmatrix}, \overline{A} = \begin{bmatrix} A & 0_{n \times (p+\gamma)} \\ 0_{(p+\gamma) \times 2} & 0_{p+\gamma} \end{bmatrix},$$

$$\overline{B} = \begin{bmatrix} B \\ 0_{(p+\gamma) \times r} \end{bmatrix}, C_1 = [\overline{C} \ I], \overline{D}_1 = \begin{bmatrix} D_1 \\ 0_{(p+\gamma) \times w} \end{bmatrix}.$$

6. The method according to claim 5, wherein, the step 5: obtaining a corresponding zonotope set according to a system state variable $\overline{x}_k$ at time k, constructing a zonotope set of a system state variable prediction set $\overline{X}_{k+1}$ at time k+1 according to the zonotope set of the system state variable $\overline{x}_k$ at time k, and constructing a strip space $s_{k+1}$ at time k+1 according to the system output variable, comprises:

5.1: constructing the zonotope set of a system state variable feasible set $\overline{X}_{k+1}$ at time k+1; setting a zonotope $z_0 = \overline{p}_0 \oplus \overline{G}_0 B^s$, corresponding to an initialization state variable $x_0$, $p_0$ representing a central point of the corresponding zonotope at the initial time, $\overline{G}_0$ representing a shape matrix of the corresponding zonotope at the initial time, and BS being a unit box composed of s unit intervals $[-1,1]$; assuming a zonotope $Z_k = \overline{p}_k \mid \overline{G}_k B^s = \langle \overline{p}_k, \overline{G}_k \rangle$ corresponding to the state variable $\overline{x}_k$ at time k, constructing the zonotope set corresponding to the system state variable prediction set $\overline{X}_{k+1}$ at time k+1:

$$\overline{X}_{k+1} = \langle \hat{\overline{p}}_{k+1}, \hat{\overline{G}}_{k+1} \rangle \quad (10)$$

$$\hat{\overline{p}}_{k+1} = T \overline{A} \overline{p}_k + T \overline{B} u_k + N \overline{y}_{k+1} \quad (11)$$

$$\hat{\overline{G}}_{k+1} = [T \overline{A} \downarrow_{re} \overline{G}_k \ T \overline{D}_1 W \ -N \overline{D}_2 \overline{V}] \quad (12)$$

$$T = \Theta^\dagger \alpha_1 + S \Psi \alpha_1, N = \Theta^\dagger \alpha_2 + S \Psi \alpha_2 \quad (13)$$

where $$\Theta = \begin{bmatrix} E \\ C_1 \end{bmatrix},$$

$\Theta^\dagger$ is the pseudo inverse of $\Theta = I_{n+2p+2\gamma} - \Theta \Theta^\dagger$, $$\alpha_1 = \begin{bmatrix} I_{n+p+\gamma} \\ 0_{(p+\gamma) \times (n+p+\gamma)} \end{bmatrix},$$

$$\alpha_2 = \begin{bmatrix} 0_{(n+p+\gamma) \times (p+\gamma)} \\ I_{n+\gamma} \end{bmatrix}.$$

$\downarrow_{re} \overline{G}_k \in \mathbb{R}^{n \times q}$ represents a generated matrix after reducing the order of the zonotope of the state at time k, and $\downarrow_{re} \overline{G}_k$ is obtained through Equations (14)-(17):

$$Z = \langle \overline{p}, \overline{G} \rangle \subseteq \overline{p} \oplus rs(\overline{G}) B'' \quad (14)$$

$$rs(\overline{G}) = \begin{bmatrix} \sum_{j=1}^{s}|\overline{G}_{1,j}| & 0 & \cdots & 0 \\ 0 & \sum_{j=1}^{s}|\overline{G}_{2,j}| & \cdots & 0 \\ \vdots & \vdots & \ddots & \vdots \\ 0 & 0 & \cdots & \sum_{j=1}^{s}|\overline{G}_{n,j}| \end{bmatrix} \quad (15)$$

$$Z = \langle \overline{p}, \overline{G} \rangle \subseteq \langle \overline{p}, \downarrow_{re}\overline{G} \rangle \quad (16)$$

$$\downarrow_{re}\overline{G} = \begin{cases} \overline{G}, & s \leq q \\ [\overline{G}_{>} \ rs(\overline{G}_{<})], & s > q \end{cases} \quad (17)$$

5.2: constructing the strip space $s_{k+1}$ at time k+1 according to the system output variable at time k+1:

$$S_{k+1} = \{\overline{x}_{k+1} \in R^{n+p+\gamma} : |C_1\overline{x}_{k+1} - \overline{y}_{k+1}| \leq \overline{D}_2\tilde{v}\} \quad (18)$$

7. The method according to claim 6, wherein the step 6: comprises:

$$\overline{x}_{k+1} \in \overline{X}_{k+1} = \langle \overline{p}_{k+1}, \overline{G}_{k+1} \rangle \quad (19)$$

$$\overline{p}_{k+1} = \hat{\overline{p}}_{k+1} + L_{k+1}(\overline{y}_{k+1} - C_1\hat{\overline{p}}_{k+1}) \quad (20)$$

$$\overline{G}_{k+1} = [(I_{n+s+\gamma} - L_{k+1}C_1)\hat{\overline{G}}_{k+1} \ L_{k+1}D_v] \quad (21)$$

$$L_{k+1} = \hat{\overline{G}}_{k+1}\hat{\overline{G}}_{k+1}^T C_1^T (C_1\hat{\overline{G}}_{k+1}\hat{\overline{G}}_{k+1}^T C_1^T + D_v D_v^T)^{-1} \text{ where,} \quad (22)$$

$$D_v = \text{diag}(\overline{D}_2\tilde{v}).$$

8. The method according to claim 7, wherein, the step 7: acquiring the state estimation interval and the fault estimation interval at time k+1 according to the zonotope set of the system state variable at time k+1, and judging whether the core temperature sensor and the surface temperature sensor in the power battery management system have a fault, comprises:
determining the state estimation interval at time k+1 according to Equation (23):

$$\begin{cases} \overline{x}_{k+1}^+(\mu) = \overline{p}_{k+1}(\mu) + \sum_{j=1}^{q}|\overline{G}_{k+1}(\mu,j)|, \mu = 1, \ldots, n+s+\gamma \\ \overline{x}_{k+1}^-(\mu) = \overline{p}_{k+1}(\mu) - \sum_{j=1}^{q}|\overline{G}_{k+1}(\mu,j)|, \mu = 1, \ldots, n+s+\gamma \end{cases} \quad (23)$$

where, $\overline{x}_{k+1}^+(\mu), \overline{x}_{k+1}^-(\mu)$ respectively represent the minimum upper bound and the maximum lower bound of state estimation at time k+1;

determining the fault estimation interval at time k+1 according to Equation (24):

$$f_{k+1}^+ = [0_{p\times n} \ I_p \ 0_{p\times \gamma}]\overline{x}_{k+1}^+ \quad (24)$$

$$f_{k+1}^- = [0_{p\times n} \ I_p \ 0_{p\times \gamma}]\overline{x}_{k+1}^-$$

where, $f_{k+1}^+$, $f_{k+1}^-$ respectively represent the minimum upper bound and the maximum lower bound of the fault estimation at time k+1, and $I_p$ is a p-order unit matrix;
if the upper and lower bounds of the fault estimation interval obtained by Equation (24) are on both sides of 0, then a power battery sensor does not have a fault;
if the upper and lower bounds of the fault estimation interval obtained by Equation (24) are on one side of 0 at the same time, the power battery sensor has a fault, and a fault value is within a fault estimation range; at the same time, when fault types are different, fault estimation intervals are different, and the fault type of the power battery sensor is judged according to the fault estimation interval.

9. The method according to claim 8, wherein, when the ambient temperature $T_e = 25°$ C. and the current is 5A, the core temperature of the power battery satisfies: $35.8°$ C. $\leq T_c \leq 35.9°$ C.

10. The method according to claim 9, wherein, the difference value between the core temperature and the surface temperature of the power battery satisfies: $5.77°$ C. $\leq T_c - T_s \leq 5.87°$ C.

11. The method according to claim 10, wherein, $$l_k = \begin{bmatrix} 0.05 \\ 0.05 \end{bmatrix},$$

$$\gamma_k = \begin{bmatrix} -5.82 \\ -35.85 \end{bmatrix},$$

$$H_k = \begin{bmatrix} -1 & 1 \\ -1 & 0 \end{bmatrix}.$$

12. A power battery system, wherein, the power battery system comprises a power battery and a power battery management system, the power battery management system comprising a core temperature sensor and a surface temperature sensor for collecting a core temperature and a surface temperature of the power battery, and the power battery system using the method according to claim 1 to perform fault detection on the core temperature sensor and the surface temperature sensor.

13. A power battery management system, comprising a core temperature sensor and a surface temperature sensor for collecting a core temperature and a surface temperature of a power battery, wherein, the power battery management system uses the method according to claim 1 to perform fault detection on the core temperature sensor and the surface temperature sensor.

* * * * *